(12) United States Patent
Kunihiro et al.

(10) Patent No.: US 11,357,147 B2
(45) Date of Patent: Jun. 7, 2022

(54) ELECTRONIC COMPONENT MOUNTING DEVICE

(71) Applicant: FUJI CORPORATION, Chiryu (JP)

(72) Inventors: Tsutomu Kunihiro, Okazaki (JP); Takeshi Nishimoto, Fuso-cho (JP); Daisuke Hattori, Seto (JP)

(73) Assignee: FUJI CORPORATION, Chiryu (JP)

( * ) Notice: Subject to any disclaimer, the term of this patent is extended or adjusted under 35 U.S.C. 154(b) by 81 days.

(21) Appl. No.: 16/759,555

(22) PCT Filed: Nov. 14, 2017

(86) PCT No.: PCT/JP2017/040952
§ 371 (c)(1),
(2) Date: Apr. 27, 2020

(87) PCT Pub. No.: WO2019/097581
PCT Pub. Date: May 23, 2019

(65) Prior Publication Data
US 2020/0288610 A1    Sep. 10, 2020

(51) Int. Cl.
*H05K 13/04* (2006.01)
*H05F 3/02* (2006.01)
*H01R 41/00* (2006.01)

(52) U.S. Cl.
CPC .......... *H05K 13/0419* (2018.08); *H05F 3/02* (2013.01); *H01R 41/00* (2013.01)

(58) Field of Classification Search
CPC ........ H01R 41/00; H05F 3/02; H05K 13/0419
See application file for complete search history.

(56) References Cited

FOREIGN PATENT DOCUMENTS

| JP | 2002232200 A | * | 8/2002 |
|---|---|---|---|
| JP | 2004-22865 A | | 1/2004 |
| JP | 2005-12001 A | | 1/2005 |
| JP | 2006-319299 A | | 11/2006 |
| JP | 2008-172021 A | | 7/2008 |
| JP | 2010103439 A | * | 5/2010 |
| JP | 2011-82400 A | | 4/2011 |

OTHER PUBLICATIONS

International Search Report dated Feb. 6, 2018 in PCT/JP2017/040952 filed Nov. 14, 2017.

* cited by examiner

*Primary Examiner* — Carl J Arbes
(74) *Attorney, Agent, or Firm* — Oblon, McClelland, Maier & Neustadt, L.L.P.

(57) ABSTRACT

An electronic component mounting device including a component tape in which a cover tape is adhered to a carrier tape accommodating multiple electronic components at a predetermined pitch; a tape feeder for feeding the component tape from a tape reel, with having a peeling mechanism for peeling the cover tape from the carrier tape at a component supply position; a mounting head configured to take out electronic components from the carrier tape at the component supply position and mount the electronic components on a board; and a tape collection portion in which a static charge elimination member is provided along a discharge path of the carrier tape from which the electronic components have been taken out, the discharge path being through a discharge duct from the tape feeder to a collection box.

6 Claims, 6 Drawing Sheets

ELECTRONIC COMPONENT MOUNTING DEVICE

TECHNICAL FIELD

The present application is an electronic component mounting device configured to use a component tape in which multiple electronic components are accommodated at a predetermined pitch in a longitudinal direction, the electronic component mounting device performing static charge elimination on a used portion of the component tape from which the electronic components are taken out.

BACKGROUND ART

As an example of an electronic component mounting device, there is a component mounting machine in which electronic components are sequentially fed out using a component tape and electronic components taken out from the component tape are mounted on a circuit board. The supplying of electronic components is performed by a detachable component supply unit, and a tape feeder or the like can be used as such a component supply unit. In the tape feeder, a component tape, in which multiple electronic components are accommodated at a constant pitch, is wound around a supply reel, and the component tape is unwound from the supply reel by pitch feeding. Further, in the component tape, a cover tape is adhered to a carrier tape in which recessed accommodation portions are formed, and the electronic components are stored in the hermetically-sealed recessed accommodation portions.

The component tape easily becomes charged with static electricity, which may cause a problem during operation of the component mounting machine, Patent Literature 1 discloses an invention in which the problem of static electricity is addressed. Specifically, when the cover tape is peeled off the component tape charged with static electricity, the electronic components which should remain in the carrier tape adhere to the cover tape and are lifted. Therefore, in the conventional example of the literature, a configuration is adopted in which a static charge elimination brush is disposed in the tape introduction opening of the main body portion of the tape feeder, and the component tape fed out from the supply reel is subjected to static charge elimination by coming in contact with the static charge elimination brush at the introduction portion of the feeder main body portion.

PATENT LITERATURE

Patent Literature 1: JP-A-2004-022865

BRIEF SUMMARY

Technical Problem

The component tape, however, also becomes charged at the component supply position of the tape feeder distal end to which the component tape is fed. This is because static electricity is generated by peeling off the cover tape from the carrier tape. Moreover, since the carrier tape is adhered to the cover tape by an adhesive, the adhesive remains on the surface from which the cover tape is peeled off. The used portion of the carrier tape from which the electronic components have been taken out (hereinafter referred to as "used carrier tape") is collected in a collection box through a discharge duct for disposal but becomes attracted to the wall surface of the discharge duct by static electricity and sticks to the wall surface due to the adhesive remaining on the used carrier tape surface.

If the used carrier tape stops advancing in the discharge duct due to sticking to the wall surface, the portion to be subsequently fed becomes entangled, causing the inside of the discharge duct to become clogged. The used carrier tape, which has not managed to enter the discharge duct, then interferes with the suction nozzle in taking out electronic components. Therefore, the operator must take care not to let the used carrier tape dog the discharge duct, and if the used carrier tape clogs the discharge duct, the used carrier tape must be removed from the discharge duct. In addition, in order to remove the used carrier tape, the component mounting machine must be temporarily stopped, thereby delaying the manufacturing of electronic boards.

In order to solve this problem, an object of the present disclosure is to provide an electronic component mounting device that performs a static charge elimination process on a used portion of the component tape.

Solution to Problem

An electronic component mounting device according to an aspect of the present disclosure includes: a component tape in which a cover tape is adhered to a carrier tape accommodating multiple electronic components at a predetermined pitch; a tape feeder for feeding the component tape from a tape reel with having a peeling mechanism peeling the cover tape from the carrier tape at a component supply position; a mounting head configured to take out electronic components from the carrier tape at the component supply position and mount the electronic components on a board; and a tape collection portion in which a static charge elimination member is provided along a discharge path of the carrier tape from which the electronic components have been taken out, the discharge path being through a discharge duct from the tape feeder to a collection box.

Advantageous Effects

With the above configuration, since the static charge elimination member is provided in the tape collection portion, and the used portion of the carrier tape, from which the electronic components have been taken out, is neutralized while being discharged, it is possible to prevent the used portion of the carrier tape from becoming attracted to the discharge duct by static electricity when the carrier tape is fed from the tape feeder to the collection box through the discharge duct.

DESCRIPTION OF EMBODIMENTS

Figure 1:
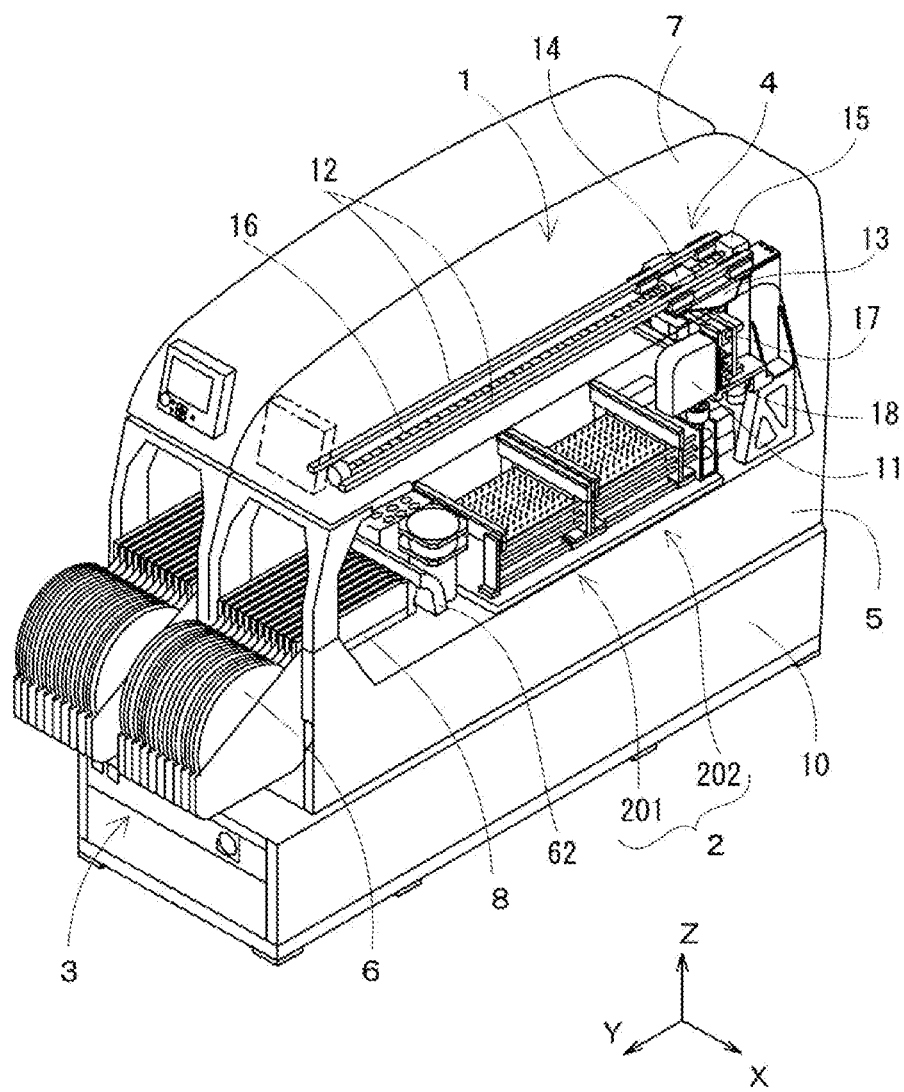
FIG. 1 An external perspective view showing an embodiment of a component mounting machine.

Next, an electronic component mounting device of an embodiment of the present disclosure will be described below with reference to the drawings. FIG. 1 is an external perspective view of a component mounting machine, a part of which is shown in a see-through manner. The electronic component mounting device of the present embodiment is a main part of a component mounting machine for mounting electronic components on a circuit board and is mainly composed of component supply device 3 for supplying electronic components, component mounting device 4 for mounting electronic components taken out from component supply device 3 to a circuit board and the like. Component mounting machine 1 constitutes a board manufacturing line with a screen printing machine, another component mounting machine, or the like, and is configured so that a circuit board is conveyed into the machine.

FIG. 1 shows a state in which two component mounting machines 1 are installed on base 10. In component mounting machine 1, a large opening is formed on the side surface in the width direction, and circuit boards can be conveyed between component mounting machine 1 and the adjacent component mounting machine. In the following description, it is assumed that the width direction of component mounting machine 1, which is the direction in which circuit boards are conveyed, is the X-axis direction, the longitudinal direction of component mounting machine 1, which is orthogonal to the X-axis direction, is the Y-axis direction, and the height direction of component mounting machine 1 is the Z-axis direction.

In component mounting machine 1, when viewed in the Y-axis direction, which is the longitudinal direction of the machine body, board conveyance device 2 for conveying circuit boards is provided in the central portion, and component supplying device 3 for supplying electronic components is provided in front of component mounting machine 1 shown at the front of the drawing. Component mounting device 4 is configured to move mounting head 11 disposed at the rear of the machine body and mounts electronic components taken out from component supply device 3 to a circuit board on board conveyance device 2.

In board conveyance device 2 of component mounting machine 1, two conveyance sections 201, 202 having the same configuration are arranged in parallel, and the conveyance of circuit boards and the mounting of electronic components to the circuit boards are performed at two places. Conveyance sections 201, 202 are both composed of a belt conveyor adapted to the size of the circuit board and are provided with a clamp mechanism for positioning the conveyed circuit board at the work position in the machine. In component supply device 3, multiple tape feeders 6 are mounted on the front portion of device main body 5. In component mounting machine 1, an opening is formed in the front portion of main body cover 7, and multiple tape feeders 6 are detachably mounted to device table 8 installed therein.

Component mounting device 4 is a working device for taking out electronic components from tape feeder 6 and mounting the electronic components on a circuit board. Component mounting device 4 is configured to move mounting head 11 that sucks and holds electronic components on the XY plane. Two Y-axis rails 12 are fixed, in parallel along the Y-axis direction, to the ceiling of main body cover 7, and Y-axis slide 13 is slidably attached to Y-axis rails 12. Nut 14 is fixed to Y-axis slide 13, and screw shaft 16 connected to Y-axis servo motor 15 passes through nut 14 and is screwed thereto.

Y-axis slide 13 is provided with X-axis rail 17, and X-axis slide 18 is slidably attached to X-axis rail 17. Mounting head 11 is attached to X-axis slide 18. A screw shaft is connected to an X-axis servo motor mounted on Y-axis slide 13, and the screw shaft is screwed to a nut fixed to the X-axis slide. Further, mounting head 11 is provided with a suction nozzle for sucking and holding electronic components, and, in particular, the suction nozzle is mounted so as to move up and down in the Z-axis direction by a lifting and lowering mechanism.

Figure 2:
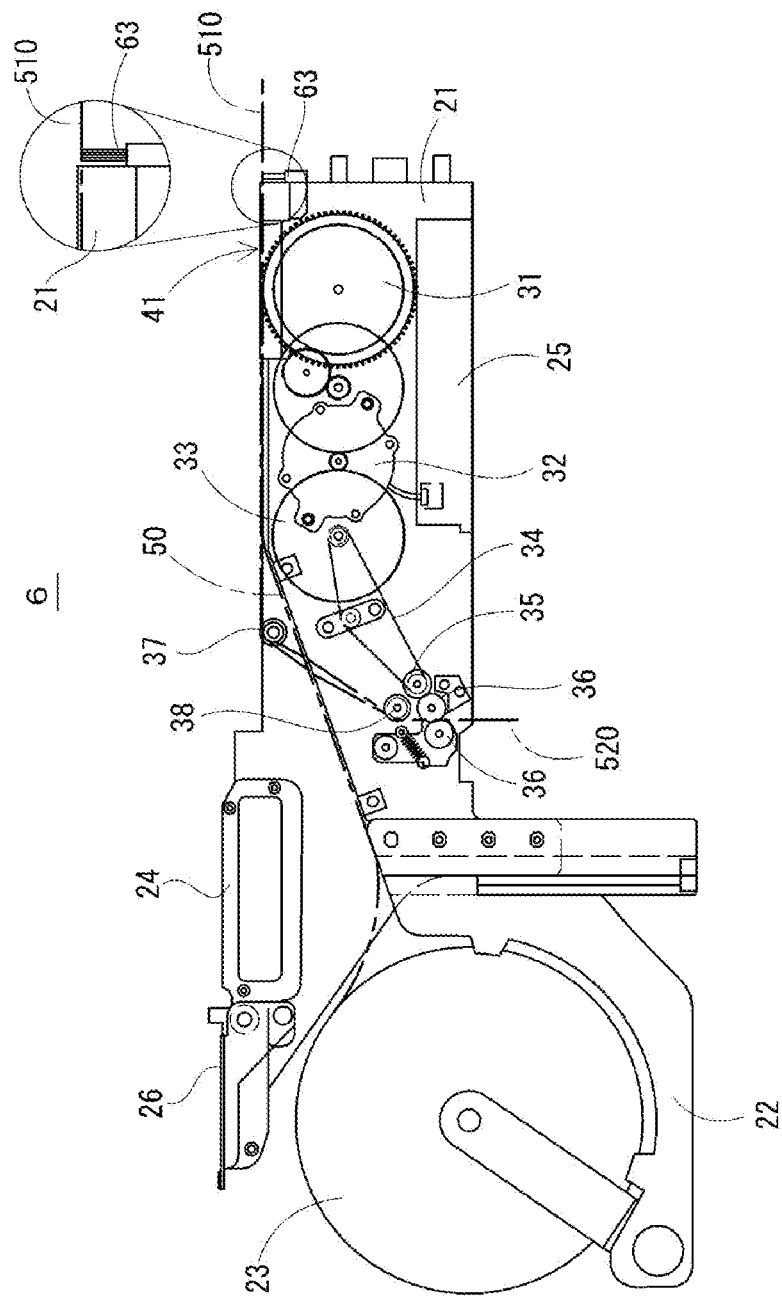
FIG. 2 A side view showing the internal structure of a tape feeder constituting a component supply device.

Next, FIG. 2 is a side view showing the internal structure of tape feeder 6 constituting component supplying device 3. Multiple slots arranged in parallel are formed in device table 8, and tape feeder 6 can be inserted and removed from each slot. Therefore, multiple tape feeders 6 are arranged in the width direction in component supply device 3. Tape feeder 6 includes a tape feeding mechanism, for feeding component tape 50 to the thin box-shaped feeder main body 21, and reel holder 22 as a reel holding portion in the rear side thereof.

In tape feeder 6, supply reel 23 on which component tape 50 is wound, is detachably mounted on reel holder 22. Handle 24 of tape feeder 6 consists of operation panel 26, connected to control board 25, and various operations on component ape 50 such as feeding out, rewinding, adjusting pitch, and the like are possible. At the same time, component tape 50 unwound from supply reel 23 is configured to be fed forward so as to slide on the upper surface of feeder main body 21. The electronic components are exposed at a location set as component supply portion 41, and the electronic components are taken out there.

Figure 3:
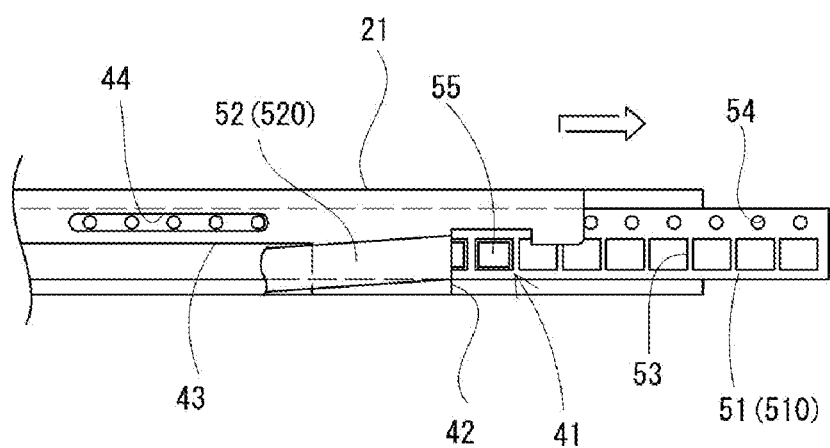
FIG. 3 A plan view showing the front portion of the tape feeder.

Here, FIG. 3 is a plan view showing a front portion of tape feeder 6 where component tape 50 is being fed out. Component tape 50 is formed by laminating the lower carrier tape 51 and the upper cover tape 52. In carrier tape 51 has recessed component accommodation portions 53 at equal intervals in the longitudinal direction, and one electronic component 55 is put into each component accommodation portion 53. Cover tape 52 is adhered to carrier tape 51 from above, sealing electronic components 55 in component accommodating portions 53.

In the longitudinal direction of carrier tape 51, a large number of feed holes 54 are formed at a constant pitch alongside component accommodating portions 53. Therefore, by way of the teeth of rotating sprocket 31 (see FIG. 2) getting caught in feed holes 54, component tape 50 is fed with a pitch in the forward direction indicated by the arrow.

In feeder main body 21, a feeding path for component tape 50 is formed in the longitudinal direction in the upper surface, and the feeding of component tape 50, which is prevented from shifting laterally or rising on the side of feeding holes 54, is stably performed by a guiding portion provided therein. In the guiding portion, a cutout portion having a shape as shown in FIG. 3 is formed as component supply portion 41, and cover tape 52 is folded back at return edge 42. Guide plate 43 has elongated feed window 44, and the teeth of sprocket 31 are engaged with feed holes 54 at that position.

As shown in FIG. 2, sprocket 31 is pivotally supported at the most frontal portion of feeder main body 21, and the rotation of drive motor 32 fixed to the rear is transmitted through multiple gears. At the same time, a configuration for peeling off cover tape 52 is provided behind drive motor 32. That is, the rotation of drive motor 32 is transmitted through gear 33, timing belt 34, and gear 35 to be applied to feed rollers 36 sandwiching cover tape 52.

Figure 4:
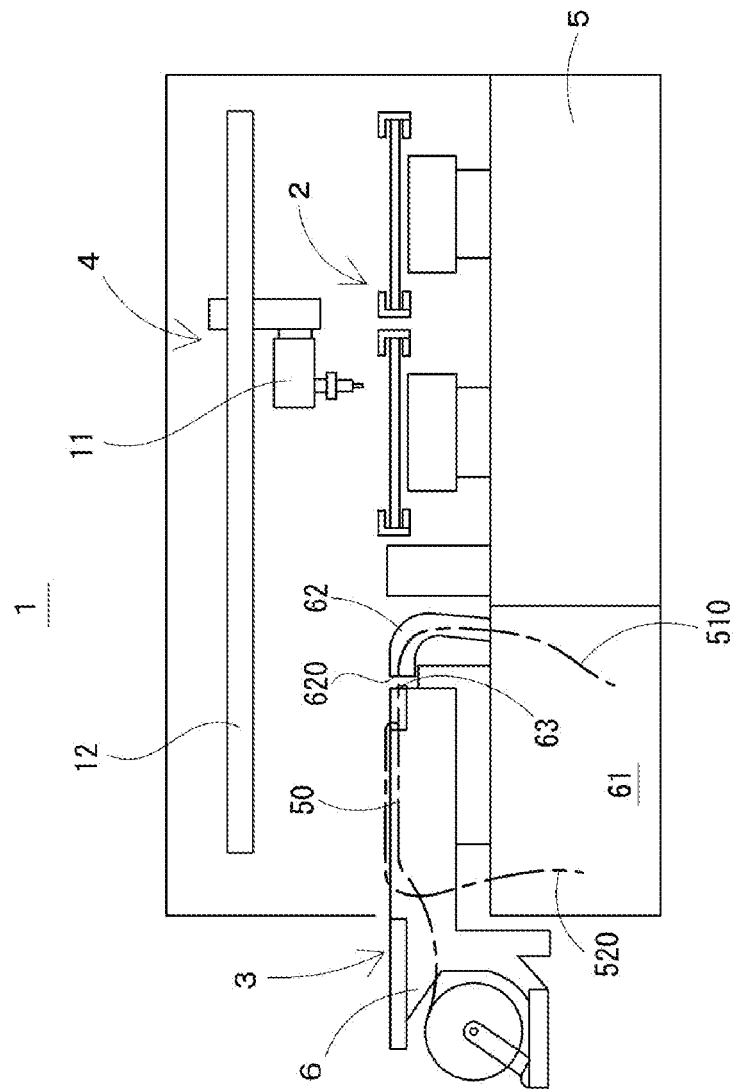
FIG. 4 A simplified side view of an embodiment of the component mounting machine.

Cover tape 52 peeled off from carrier tape 51 is collected as a used portion of cover tape 520 (hereinafter referred to as "used cover tape"). Used cover tape 520 is reversed to the rear of tape feeder 6 at return edge 42 (see FIG. 3) and is fed to the pair of feed rollers 36 through taper rollers 37, 38. Electronic component mounting machine 1 is provided with collection box 61 for collecting fed used cover tape 520, as shown in FIG. 4. FIG. 4 is a side view showing component mounting machine 1 in a simplified manner.

In component mounting machine 1, collection box 61 is formed inside device main body 5 on which board conveyance device 2, component supply device 3, and component mounting device 4 are installed, and used cover tape 520 is fed into collection box 61 and collected. In the electronic component mounting device of component mounting machine 1, the tape collection portion is configured to feed used portion 510 of the carrier tape, from which electronic component 55 has been taken out, to collection box 61.

The tape collection portion is provided with discharge duct 62 for guiding used carrier tape 510 to collection box 61. Carrier tape 51 is fed out by sprocket 31 as described above, and used carrier tape 510, from which electronic component 55 is taken out, is fed out by continuing the feeding. Thus, discharge duct 62 is provided as a passage to collection box 61 in the advancing direction of used carrier tape 510. Used carrier tape 510 fed from the distal end of tape feeder 6, due to lack of support in this portion, is deflected by its own weight so that used carrier tape 510 proceeds toward collection box 61 below. Discharge duct 62 is formed so as to match the discharge path of used carrier tape 510.

Figure 5:
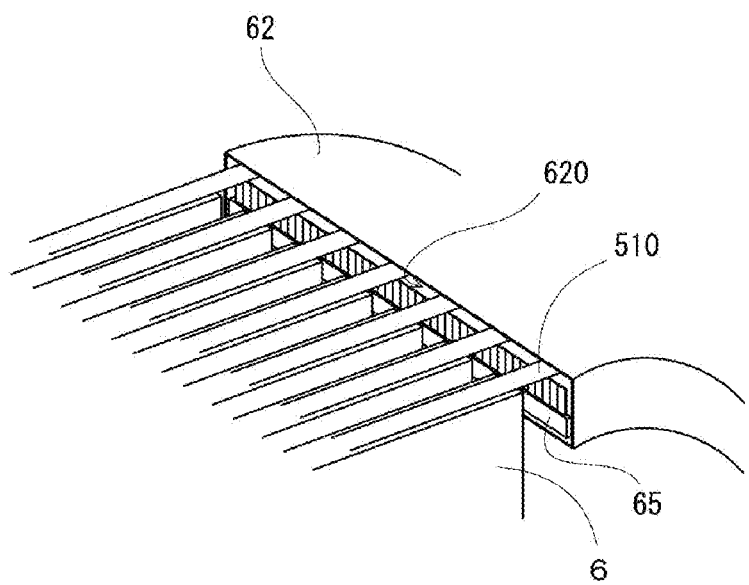
FIG. 5 A simplified perspective view showing a used carrier tape being fed into a discharge duct to which a static charge elimination brush is attached.

Discharge duct 62 is formed with rectangular tape slot 620 (see FIG. 5) which opens laterally toward tape feeder 6 (the front side of the machine body) and extends from there through a curved cylindrical portion toward collection box 61 below. The lower end of discharge duct 62, which is opposite to tape slot 620, is connected to the upper opening of collection box 61. Discharge duct 62 is formed not only to handle one tape feeder 6 but also to handle multiple tape feeders and, therefore, has a width corresponding to the width of device table 8, as shown in FIG. 5. Since multiple tape feeders 6 are arranged side by side on device table 8, discharge duct 62 is formed so that used carrier tape 510 enters tape slot 620 of discharge duct 62 regardless of the position of tape feeder 6.

Such a tape collection portion is provided with a static charge elimination member. As described above, static electricity is generated by peeling cover tape 52 from carrier tape 51, causing used carrier tape 510 passing through discharge duct 62 to become attracted to the wall surface. Used carrier tape 510 is supposed to pass through discharge duct 62 without contact or fall into collection box 61 by sliding down even if contact is made. However, static electricity causes used carrier tape 510 to become attracted to the wall surface and used carrier tape 510 easily adheres to the wall surface due to the adhesive on the top surface of the tape to which cover tape 52 was adhered.

Due to its own elasticity, used carrier tape 510 curves downward in discharge duct 62 as it is fed in the advancing direction downward, but used carrier tape 510 easily sticks to collection box 61 where the direction changes from the lateral feeding direction to the downward direction. Therefore, it is desirable to eliminate static charge at a position before the position at which used carrier tape 510 tends to stick to the wall surface. To this end, in the present embodiment, as shown in the enlarged portion of FIG. 2, static charge elimination brush 63 is attached to the distal end portion of tape feeder 6.

Static charge elimination brush 63 is attached to the distal end of tape feeder 6 so as to match the width of feeder main body 21. Static charge elimination brush 63 is formed as a small tip having a rectangular shape in which a brush portion of conductive fibers is bundled together by a metal plate brush body.

Static charge elimination brush 63 is screwed to the distal end face of feeder main body 21 by a bolt. Static charge elimination brush 63 is attached to tape feeder 6, under used carrier tape 510, so as to be perpendicular to the tape. In this case, it is not always necessary to bring the tip of static charge elimination brush 63 into contact with used carrier tape 510 as long as there is a static charge elimination effect.

Alternatively, static charge elimination brush 63 may be secured by an adhesive agent or the like instead of screwing and therefore the structure of static charge elimination brush 63 may also be configured such that brush portions are bundled in advance by an adhesive tape or the like. Further, a brush pocket may be formed on the distal end face of feeder main body 21, and static charge elimination brush 63 may be inserted into the brush pocket. Static charge elimination brush 63 is connected to earth ground so that electric charge can flow quickly.

Incidentally, in a structure in which static charge elimination brush 63 is attached to each tape feeder 6, static charge elimination brush 63 may be a small component, and work of attaching the brush becomes burdensome. Therefore, as another embodiment, a static charge elimination brush may be attached to discharge duct 62. As shown in FIG. 5, discharge duct 62 has a size for handling all tape feeders 6 attached to device table 8. For this purpose, long static charge elimination brush 65 having a large lateral width is used and is attached to tape slot 620 as shown in the figure. FIG. 5 is a simplified perspective view showing used carrier tape 510 being fed from tape feeder 6 to discharge duct 62.

Long static charge elimination brush 65 is fixed to the lower side of tape slot 620 of discharge duct 62, and the brush portion of the conductive fiber is arranged on the lower side of used carrier tape 510 and is provided in an upright state so as to be substantially perpendicular to the tape. It is possible that tape slot 620 of discharge duct 62 is not large enough. Consequently, the leading end of used carrier tape 510 may come in contact with long static charge elimination brush 65 causing the advancing direction to be directed upward and miss tape slot 620. Therefore, although the end of long static charge elimination brush 65 is at a height at which contact is made with the lower surface of used carrier tape 510, however, as long as there is a static charge elimination effect, contact is not necessarily made directly, and it is permissible to have no contact. Long static charge elimination brush 65 is also connected to earth ground so that electric charge can be discharged quickly.

Figure 6:
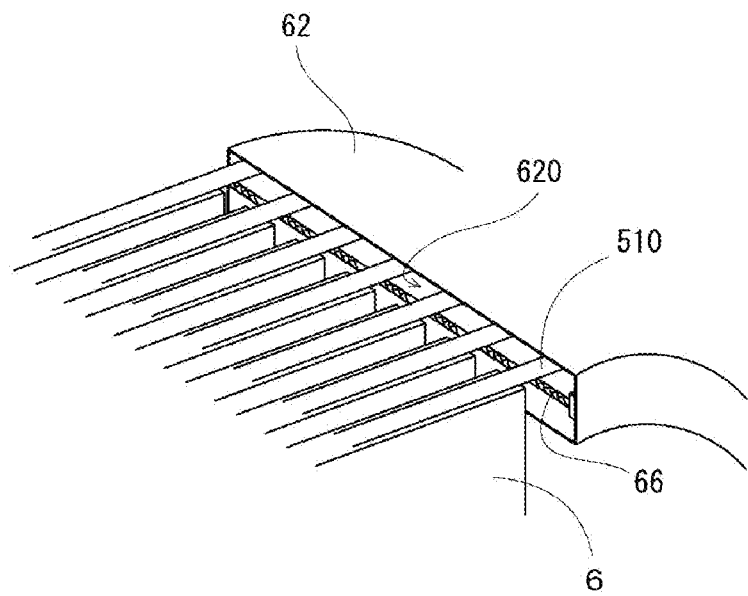
FIG. 6 A simplified perspective view showing the used carrier tape being fed into a discharge duct to which a static charge elimination cord is attached.

Next, FIG. 6 is a simplified perspective view showing another embodiment in which used carrier tape 510 is fed from tape feeder 6 to discharge duct 62. In the present embodiment, static charge elimination cord 66, formed by processing, for example, fibrous stainless steel into a cord shape, is horizontally stretched over tape slot 620 of discharge duct 62. Static charge elimination cord 66 is stretched, in a non-contact state, under a position at which used carrier tape 510 passes, and static charge elimination cord 66 is also connected to earth ground.

It is preferable to attach long static charge elimination brush 65 or static charge elimination cord 66 to a position beyond tape slot 620 inside discharge duct 62 so as to ensure the leading end of used carrier tape 510 advances inside discharge duct 62 even if used carrier tape 510 is contacted and changes direction as described above. In addition, although long static charge elimination brush 65 and static charge elimination cord 66 are described as being disposed below the position where used carrier tape 510 passes, long static charge elimination brush 65 and static charge elimination cord 66 may be disposed above, or both above and below, used carrier tape 510. Further, instead of long static charge elimination brush 65, a static charge elimination plate made of gold, silver, copper, aluminum, stainless steel, or the like, which is formed in the same size, may be attached.

In this way, in component mounting machine 1 as described above, electronic component 55 taken out by mounting head 11 from component supply device 3 is mounted on the conveyed circuit board. In the electronic component mounting device, component tape 50 is unwound from supply reel 23 of tape feeder 6 by pitch feeding, and cover tape 52 is peeled off from carrier tape 510 so that electronic component 55 can be taken out by mounting head 11. The peeled-off used cover tape 520 is reversed and fed to feed rollers 36, and then put into collection box 61.

At the same time, used carrier tape 510 continues to advance, ejects out from the distal end of tape feeder 6, enters discharge duct 62 through tape slot 620, and is similarly collected in collection box 61. Since the tape collection portion is provided with a static charge elimination member such as static charge elimination brush 63, long static charge elimination brush 65, static charge elimination cord 66, or a static charge elimination plate, static charge is eliminated by the static charge elimination member even if used carrier tape 510 is charged by the peeling of cover tape 52. The neutralized used carrier tape 510 can be prevented from becoming attracted and sticking to the wall surface when passing through discharge duct 62. That is, used carrier tape 510 is properly fed into a recovery duct.

Although an embodiment of the present disclosure has been described above, the present disclosure is not limited thereto, and various modifications can be made without departing from the spirit thereof. For example, although discharge duct 62 in which the area of tape slot 620 is small is shown in the above embodiment, the tape slot may be a discharge duct having a large opening upward.

REFERENCE SIGNS LIST

1 . . . Component mounting machine 3 . . . Component supply device 4 . . . Component mounting device 6 . . . Tape feeder 11 . . . Mounting head 50 . . . Component tape 51 . . . Carrier tape 52 . . . Cover tape 55 . . . Electronic component 61 . . . Collection box 62 . . . Discharge duct 510 . . . Used carrier tape 520 . . . Used cover tape

The invention claimed is:

1. An electronic component mounting device comprising:
a component tape in which a cover tape is adhered to a carrier tape accommodating multiple electronic components at a predetermined pitch;
a tape feeder for feeding the component tape from a tape reel, the tape feeder having a peeling mechanism peeling the cover tape from the carrier tape at a component supply position;
a mounting head configured to take out electronic components from the carrier tape at the component supply position and mount the electronic components on a board; and
a tape collection portion in which a static charge elimination member is provided along a discharge path of the carrier tape from which the electronic components have been taken out, the discharge path being through a discharge duct from the tape feeder to a collection box,
wherein the static charge elimination member is disposed below the carrier tape from which the electronic components have been taken out.

2. The electronic component mounting device of claim 1, wherein the static charge elimination member is attached to the distal end of the tape feeder.

3. The electronic component mounting device of claim 1, wherein the static charge elimination member is attached to a tape insertion slot of the discharge duct.

4. The electronic component mounting device of claim 1, wherein the static charge elimination member is a static charge elimination brush, a static charge elimination plate, or a static charge elimination cord.

5. The electronic component mounting device of claim 1, wherein the static charge elimination member is free of contact with the carrier tape passing through the tape collection portion.

6. The electronic component mounting device of claim 1, wherein the discharge duct includes a tape slot which opens laterally toward the tape feeder, and extends from the tape slot through a curved cylindrical portion toward the collection box below, a lower end of the discharge duct, which is opposite to the tape slot, being connected to an upper opening of the collection box.

* * * * *